United States Patent
Morimoto

(10) Patent No.: US 11,751,326 B2
(45) Date of Patent: Sep. 5, 2023

(54) ELECTRONIC APPARATUS AND INSPECTION METHOD

(71) Applicant: SHARP KABUSHIKI KAISHA, Sakai (JP)

(72) Inventor: Mitsuaki Morimoto, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 244 days.

(21) Appl. No.: 17/324,784

(22) Filed: May 19, 2021

(65) Prior Publication Data

US 2021/0368617 A1  Nov. 25, 2021

Related U.S. Application Data

(60) Provisional application No. 63/028,924, filed on May 22, 2020.

(51) Int. Cl.
*H05K 1/02* (2006.01)
*H05K 1/11* (2006.01)
(Continued)

(52) U.S. Cl.
CPC ....... *H05K 1/0268* (2013.01); *G01R 1/06794* (2013.01); *G01R 1/07314* (2013.01); *H05K 1/0269* (2013.01); *H05K 1/118* (2013.01); *H05K 1/0346* (2013.01); *H05K 1/189* (2013.01); *H05K 2201/094* (2013.01); *H05K 2201/09227* (2013.01); *H05K 2201/09409* (2013.01);
(Continued)

(58) Field of Classification Search
CPC .... H05K 1/0268; H05K 1/0269; H05K 1/118; H05K 1/0346; H05K 1/189; H05K 2201/09227; H05K 2201/094; H05K 2201/09409; H05K 2201/09445; H05K 2201/09909; H05K 2201/10136; H05K 1/111; H05K 2201/0154; G01R 1/06794; G01R 1/07314; G01R 31/2818
See application file for complete search history.

(56) References Cited

U.S. PATENT DOCUMENTS 11,029,331 B2 * 6/2021 Wang ............... H05K 1/0268
2004/0159930 A1 8/2004 Makita et al.
(Continued)

FOREIGN PATENT DOCUMENTS

JP  2004-095756 A  3/2004

*Primary Examiner* — Jermele M Hollington
*Assistant Examiner* — Zannatul Ferdous
(74) *Attorney, Agent, or Firm* — ScienBiziP, P.C.

(57) ABSTRACT

An electronic apparatus includes: an electronic module; and a flexible substrate electrically connected to the electronic module. The flexible substrate includes: a base film; a plurality of first contact pads arranged at one end on the base film in a first direction, and electrically connected to the electronic module; a plurality of second contact pads arranged at an other end on the base film in the first direction; a plurality of first wires arranged on the base film, and each electrically connecting one of the first contact pads and one of the second contact pads together; and a plurality of third contact pads arranged on the base film, each of the third contact pads being positioned along the first direction between one of the first contact pads and one of the second contact pads, and being electrically connected to one of the first wires.

7 Claims, 2 Drawing Sheets

(51) Int. Cl.
*G01R 1/073* (2006.01)
*G01R 1/067* (2006.01)
*H05K 1/18* (2006.01)
*H05K 1/03* (2006.01)

(52) U.S. Cl.
CPC .............. *H05K 2201/09445* (2013.01); *H05K 2201/09909* (2013.01); *H05K 2201/10136* (2013.01)

(56) References Cited

U.S. PATENT DOCUMENTS

| 2005/0156295 | A1* | 7/2005 | Corisis | H01L 23/5385 |
| | | | | 257/668 |
| 2018/0164343 | A1* | 6/2018 | Wang | H05K 1/0268 |
| 2019/0064900 | A1* | 2/2019 | Lee | G06F 1/266 |

* cited by examiner

ELECTRONIC APPARATUS AND INSPECTION METHOD

CROSS-REFERENCE TO RELATED APPLICATION

The present application claims priority from Provisional Application No. 63/028,924, the content to which is hereby incorporated by reference into this application.

BACKGROUND OF THE INVENTION

1. Field of the Invention

The present invention relates to an electronic apparatus and an inspection method.

2. Description of the Related Art

Patent Document 1 (Japanese Unexamined Patent Application Publication No. 2004-095756) discloses an example of an electronic apparatus in which an electronic module such as a semiconductor device is mounted on a flexible wiring substrate.

SUMMARY OF THE INVENTION

In the electronic apparatus described in Patent Document 1, for example, a connection terminal for connecting the electronic apparatus to the body of a product is also used for an inspection of the electronic apparatus. As wires in recent years are designed finer, areas of connection terminals become narrower. Hence, when a contact pin comes into contact with a connection terminal for the inspection, the contact pin might be misaligned. This misalignment could cause a short-circuit between neighboring connection terminals. An aspect of the present invention is intended to provide an electronic apparatus capable of, for example, preventing a shirt-circuit during an inspection.

Solution to Problem

An electronic apparatus according to an aspect of the present invention includes: an electronic module; and a flexible substrate electrically connected to the electronic module. The flexible substrate includes: a base film; a plurality of first contact pads arranged at one end on the base film in a first direction, and electrically connected to the electronic module; a plurality of second contact pads arranged at an other end on the base film in the first direction; a plurality of first wires arranged on the base film, and each electrically connecting one of the first contact pads and one of the second contact pads together, and a plurality of third contact pads arranged on the base film, each of the third contact pads being positioned along the first direction between one of the first contact pads and one of the second contact pads, and being electrically connected to one of the first wires.

DETAILED DESCRIPTION OF THE INVENTION

Described below is an example of a preferable embodiment of the present invention. Note that the embodiment below is an example, and the present invention shall not be limited to the embodiment.

Figure 1:
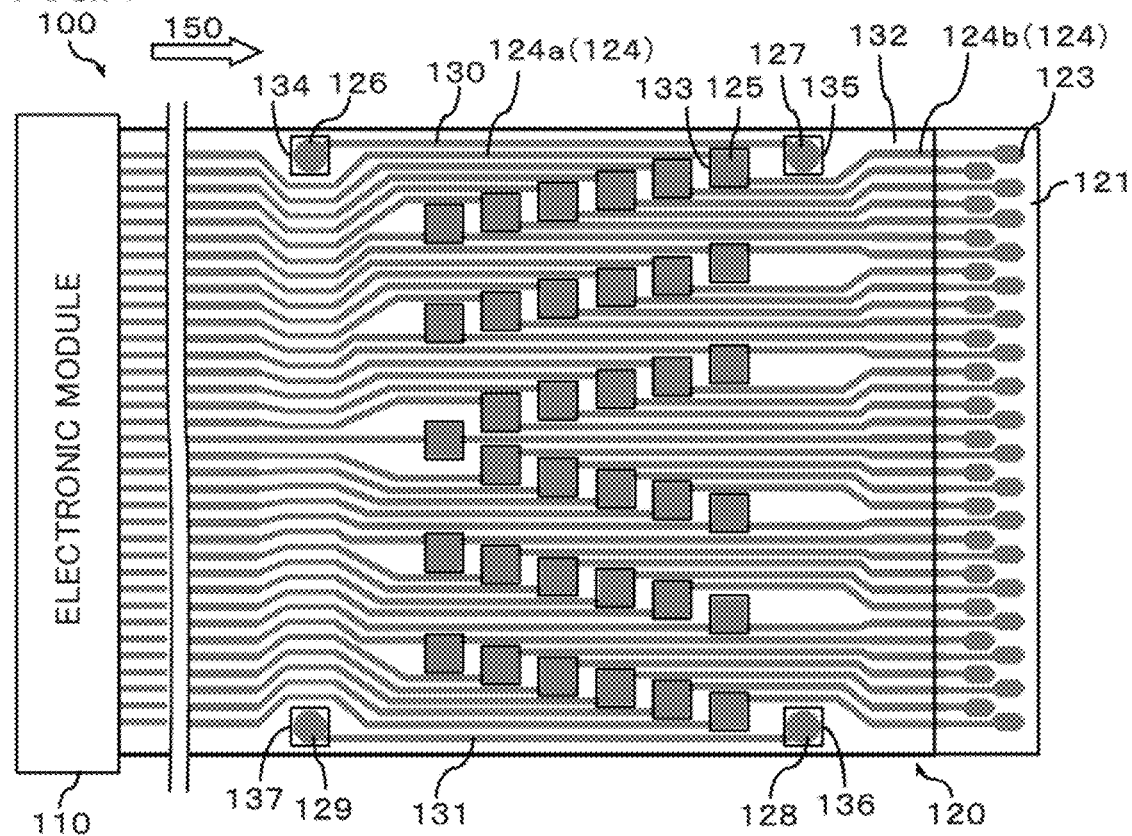
FIG. 1 is a schematic view illustrating an example of an electronic apparatus.
Figure 2:
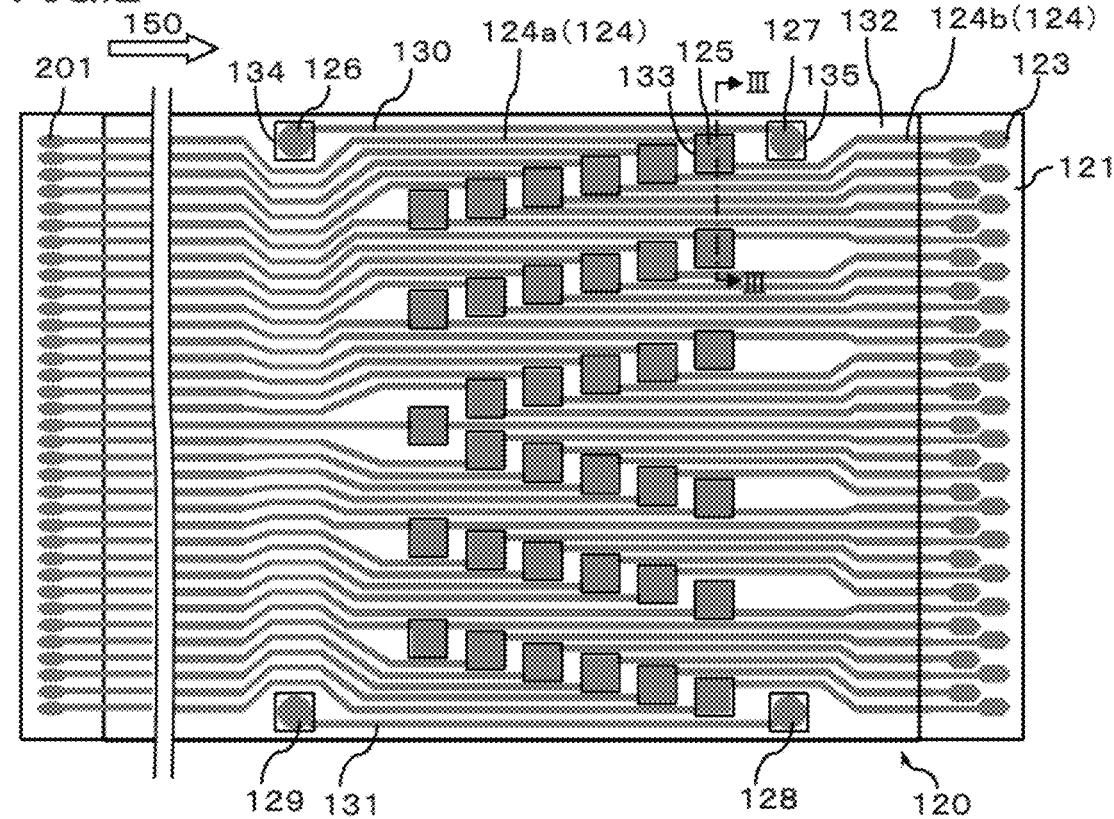
FIG. 2 is a top view illustrating an example of a flexible substrate in FIG. 1.
Figure 3:
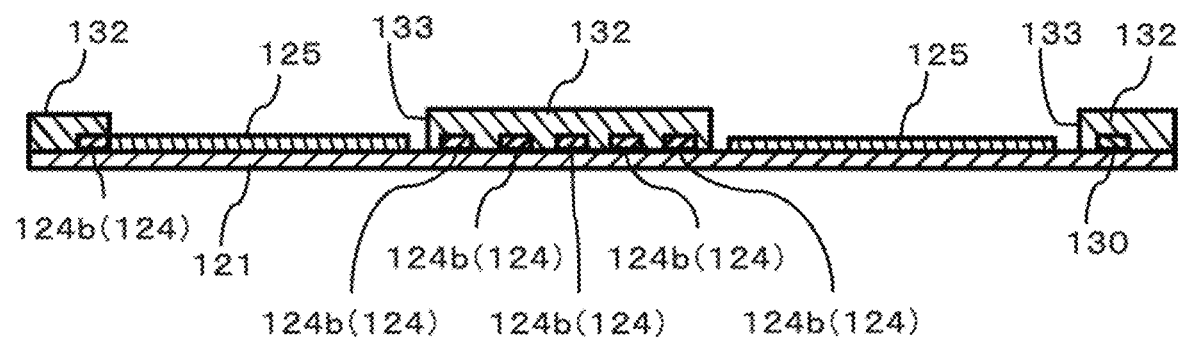
FIG. 3 is a cross-sectional view along arrows III-III of FIG. 2.

FIG. 1 is a schematic view illustrating an electronic apparatus 100 of this embodiment. FIG. 2 is a top view illustrating an example of a flexible substrate 120. FIG. 3 is a cross-sectional view along arrows III-III of FIG. 2.

As illustrated in FIG. 1, the electronic apparatus 100 includes, for example, an electronic module 110 and a flexible substrate 120.

Examples of the electronic module 110 include such a display module as a liquid crystal module and a semiconductor module. The electronic module 110 includes, for example, a plurality of terminals (not shown) for electrically connecting the electronic module 110 to the flexible substrate 120.

The flexible substrate 120 is electrically connected to the electronic module 110. The flexible substrate 120 extends, for example, in a first direction indicated by an arrow 150 of FIG. 1. The flexible substrate 120 is what is referred to as a wiring substrate on which such parts as wires and contact pads are formed.

The flexible substrate 120 includes, for example: a base film 121: a plurality of first contact pads 201; a plurality of second contact pads 123; a plurality of first wires 124; a plurality of third contact pads 125; a fourth contact pad 126; a fifth contact pad 127; a sixth contact pad 128; a seventh contact pad 129; a second wire 130; a third wire 131; and an insulating film 132.

The base film 121 extends, for example, in the first direction indicated by the arrow 150 of FIGS. 1 and 2. That is, when the flexible substrate 120 is electrically connected to the electronic module 110, the base film 121 extends from the electronic module 110 in the first direction. Note that the first direction is an in-plane direction in which the base film 121 lies. Moreover, example materials of the base film 121 include such a flexible resin as polyimide.

Provided on the base film 121 are, for example: the first contact pads 201; the second contact pads 123; the first wires 124; the third contact pads 125; the fourth contact pad 126; the fifth contact pad 127; the sixth contact pad 128; the seventh contact pad 129; the second wire 130; the third wire 131; and the insulating film 132. Note that, the descriptions below are focused on a combination of one of the first contact pads 201, one of the second contact pads 123, one of the first wire 124, and one of the third contact pads 125. Two or more of such combinations are provided on the base film 121.

The first contact pads 201 are arranged at one end on the base film 121 in the first direction. The first contact pads 201 are electrically connected to the electronic module 110. More specifically, each of the first contact pads 201 is electrically connected to a corresponding one of terminals of the electronic module 110. Hence, the electronic module 110 and the flexible substrate 120 are electrically connected together. The connection of the first contact pads 201 and the terminals of the electronic module 110 is not limited to a particular manner. For example, the first contact pads 201 and the terminals may be connected together with a conductive material or with a connector. Note that the number of the first contact pads 201 is not limited to a particular number.

The second contact pads 123 are provided at an other end of the base film 121 in the first direction; that is, the second contact pads 123 are provided on the base film 121 across from the first contact pads 201. The second contact pads 123 are, for example, product connection contact pads to establish electrical connection to a product that transmits and receives an electric signal to and from the electronic module 110. On each of the second contact pads 123, for example, a conductive material is disposed. This conductive material can readily establish electrical connection to the product. Examples of this conductive material include conductive paste, solder, and conductive film. Furthermore, the second contact pads 123 may be provided with a connector.

The second contact pads 123 are, for example, arranged on the other end of the base film 121, and displaced in relation to one an other. Since the base film 121 has a limited area, such an arrangement makes it possible to design the first wires 124 thinner and to secure an area for electrical connection to the product. The second contact pads 123 may be terminals for connection to the product. Note that the number of the second contact pads 123 is not limited to a particular number. For example, the number of the second contact pads 123 may be the same as that of the first contact pads 201, so that each of the second contact pads 123 corresponds to one of the first contact pads 201. Furthermore, one first contact pad 201 may correspond to two or more of the second contact pads, or two or more of the first contact pads 201 may correspond to one second contact pad, such that the number of the first contact pads may be different from that of the second contact pads.

The first wires 124 electrically connect, for example, the first contact pads 201 and the second contact pads 123 together. Each of the first wires 124 electrically connects one of the first contact pads 201 and one of the second contact pads 123 together. More specifically, each of the first wires 124 includes, for example: a first wire 124a electrically connecting a first contact pad 201 and a third contact pad 125 together; and a first wire 124b electrically connecting a second contact pad 123 and the third contact pad 125 together. That is, the first wire 124a and the first wire 124b can be interpreted as a part of the first wire 124. Moreover, for example, the first wires 124 extend in the first direction, and are arranged along with one an other. Furthermore, for example, the first wires 124 are designed narrower than the first contact pads 201 and the second contact pads 123.

The third contact pads 125 are, for example, inspection contact pads to be used for an inspection of the electronic module 110. Each of the third contact pads 125 is, for example, positioned along the first direction between one of the first contact pads 201 and one of the second contact pads 123. Moreover, each of the third contact pads 125 is electrically connected to one of the first wires 124 electrically connecting one of the first contact pads 201 and one of the second contact pads 123 together.

The third contact pads 125 are, for example, larger in area than the second contact pads 123. Furthermore, a distance between two of the third contact pads 125 closest to each other is longer than a distance between two of the second contact pads 123 closest to each other. Such a feature makes it possible to readily allow a plurality of first contact pins 402, of an inspection contact block 400, each to come into contact with the respective third contact pads 125. The contact block 400 will be described later.

Moreover, two of the third contact pads 125 closest to each other are disposed in different positions along, for example, the first direction. Thanks to these features, even if the first contact pins 402 of the inspection contact block 400 for inspecting the electronic module 110 are more or less misaligned when coming into contact with the respective third contact pads 125, each of the first contact pins 402 can come into contact with a corresponding one of the third contact pads 125. Simultaneously, the features can reduce the risk that each first contact pin 402 might come into contact with a third contact pad 125 not corresponding to the first contact pin 402.

The fourth contact pad 126, the fifth contact pad 127, the sixth contact pad 128, and the seventh contact pad 129 are used for positioning the flexible substrate 120 with respect to the inspection contact block 400 to be described later, and for checking contact between the flexible substrate 120 and the inspection contact block 400.

The fourth contact pad 126 is positioned, for example, at the one end on the base film 121 in the first direction; that is, the fourth contact pad 126 is positioned closer to the first contact pads 201 than the third contact pads 125 are.

The fifth contact pad 127 is positioned, for example, at the other end on the base film 121 in the first direction; that is, the fifth contact pad 127 is positioned closer to the second contact pads 123 than the third contact pads 125 are. As can be seen, the fourth contact pad 126 and the fifth contact pad 127 are disposed in different positions along the first direction.

The fourth contact pad 126 and the fifth contact pad 127 are electrically connected together through the second wire 130. Furthermore, the fourth contact pad 126, the fifth contact pad 127, and the second wire 130 are electrically insulated from the first wires. Moreover, the fourth contact pad 126, the fifth contact pad 127, and the second wire 130 are positioned at one end on the base film 121 in a second direction orthogonal to the first direction. The fourth contact pad 126 and the fifth contact pad 127 are positioned closer to the one end of the base film 121 in the second direction than the third contact pads 125 are.

The sixth contact pad 128 is positioned, for example, at the other end on the base film 121 in the first direction; that is, the sixth contact pad 128 is positioned closer to the second contact pads 123 than the third contact pads 125 are.

The seventh contact pad 129 is positioned, for example, at the one end on the base film 121 in the first direction; that is, the seventh contact pad 129 is positioned closer to the first contact pads 201 than the third contact pads 125 are. That is, the sixth contact pad 128 and the seventh contact pad 129 are disposed in different positions along the first direction.

The sixth contact pad 128 and the seventh contact pad 129 are electrically connected together through the third wire 131. Furthermore, the sixth contact pad 128, the seventh contact pad 129, and the third wire 131 are electrically insulated from the first wires 124. Moreover, the sixth contact pad 128, the seventh contact pad 129, and the third wire 131 are positioned on the base film 121 in the second direction across from the fourth contact pad 126, the fifth contact pad 127, and the second wire 130. That is, the sixth contact pad 128, the seventh contact pad 129, and the third wire 131 are positioned at an other end of the base film 121 in the second direction.

As illustrated in, for example, FIG. 3, the insulating film 132 is disposed on the base film 121 to cover the first wires 124. This insulating film 132 can protect the first wires 124 and prevent the first wires 124 from, for example, short-circuiting. Furthermore, the insulating film 132 includes a through hole 133 that coincide with each of the third contact pads 125. The third contact pads 125 are exposed from the insulating film 132 via through holes 133 including the through hole 133. Moreover, the through holes 133 allow the first contact pins 402 to pass therethrough. Each of the third contact pads 125 may entirely or partially be exposed. The first contact pins 402 will be described later. Note that the insulating film 132 does not cover neither the first contact pads 201 nor the second contact pads 123. The insulating film 132 does not have to cover: portions, of the first wires 124, in contact with the first contact pads 201; or portions, of the first wires 124, in contact with the second contact pads 123.

Furthermore, the insulating film 132 includes a through hole 134, a through hole 135, a through hole 136, and a through hole 137 that respectively coincide with the fourth contact pad 126, the fifth contact pad 127, the sixth contact pad 128, and the seventh contact pad 129. The fourth contact pad 126, the fifth contact pad 127, the sixth contact pad 128, and the seventh contact pad 129 are exposed from the insulating film 132 respectively through the through hole 134, the through hole 135, the through hole 136, and the through hole 137.

Figure 4:
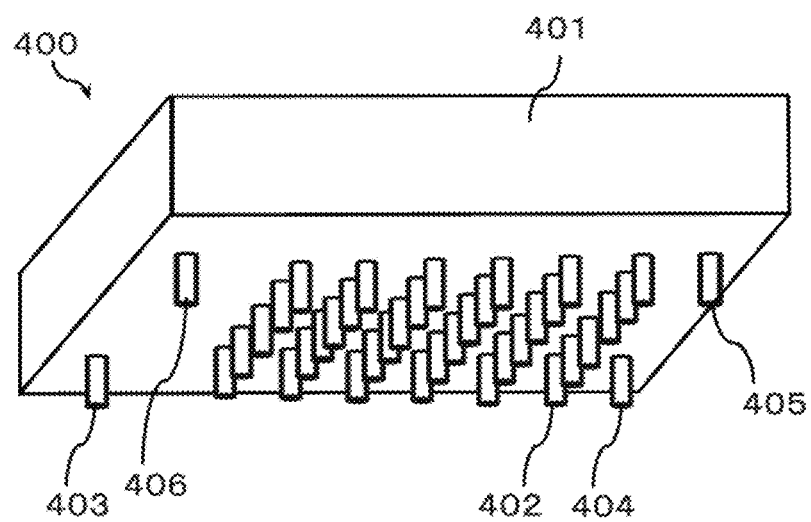
FIG. 4 is a perspective view illustrating an example of an inspection contact block.

The electronic apparatus 100 is inspected with, for example, an inspection apparatus. This inspection apparatus includes, for example, the inspection contact block (a block) 400 illustrated in FIG. 4 and an inspection unit. In the configuration of the inspection apparatus, the inspection contact block 400 is pressed against the flexible substrate 120, and the inspection unit inspects the electric apparatus 100.

The inspection contact block 400 includes, for example: a body 401; the first contact pins 402; a second contact pin 403; a third contact pin 404; a fourth contact pin 405; and a fifth contact pin 406. The first contact pins 402, the second contact pin 403, the third contact pin 404, the fourth contact pin 405, and the fifth contact pin 406 protrude from the body 401.

Each of the first contact pins 402 included in the body 401 is positioned to be able to come into contact with a corresponding one of the third contact pads 125 when the inspection contact block 400 is pressed against the flexible substrate 120.

The second contact pin 403 included in the body 401 is positioned to be able to come into contact with the fourth contact pad 126 when the inspection contact block 400 is pressed against the flexible substrate 120.

The third contact pin 404 included in the body 401 is positioned to be able to come into contact with the fifth contact pad 127 when the inspection contact block 400 is pressed against the flexible substrate 120.

The fourth contact pin 405 included in the body 401 is positioned to be able to come into contact with the sixth contact pad 128 when the inspection contact block 400 is pressed against the flexible substrate 120.

The fifth contact pin 406 included in the body 401 is positioned to be able to come into contact with the seventh contact pad 129 when the inspection contact block 400 is pressed against the flexible substrate 120.

Furthermore, the first contact pins 402, the second contact pin 403, the third contact pin 404, the fourth contact pin 405, and the fifth contact pin 406 protruding from the body 401 have tip ends flush with one an other in the same plane.

Described next is how to conduct an inspection with the electronic apparatus 100.

The inspection contact block 400 is pressed against the flexible substrate 120 of the electronic apparatus 100.

Next, the second contact pin 403 and the third contact pin 404 are checked for electrical connection therebetween. Specifically, for example, the inspection unit connected to the inspection contact block 400 determines whether a current flows between the second contact pin 403 and the third contact pin 404. The fourth contact pad 126 and the fifth contact pad 127 are electrically connected together with the second wire 130. Thus, if the current flows between the second contact pin 403 and the third contact pin 404, the inspection unit determines that the second contact pin 403 and the fourth contact pad 126 are electrically connected together, and the third contact pin 404 and the fifth contact pad 127 are electrically connected together. Hence, the inspection unit determines that the inspection contact block 400 is pressed against a predetermined position of the flexible substrate 120; that is, the inspection contact block 400 and the flexible substrate 120 are successfully positioned in relation to each other.

Furthermore, the fourth contact pin 405 and the fifth contact pin 406 may be checked for electrical connection therebetween. Specifically, for example, the inspection unit determines whether a current flows between the fourth contact pin 405 and the fifth contact pin 406. The sixth contact pad 128 and the seventh contact pad 129 are electrically connected together with the third wire 131. Thus, if the current flows between the fourth contact pin 405 and the fifth contact pin 406, the inspection unit determines that the fourth contact pin 405 and the sixth contact pad 128 are electrically connected together, and the fifth contact pin 406 and the seventh contact pad 129 are electrically connected together. Hence, the inspection unit determines that the inspection contact block 400 is pressed against a predetermined position of the flexible substrate 120; that is, the inspection contact block 400 and the flexible substrate 120 are successfully positioned in relation to each other. In conjunction with the above determination of the positioning between the second contact pin 403 and the third contact pin 404, the inspection contact block 400 and the flexible substrate 120 are positioned more precisely.

As can be seen, the positioning of the inspection contact block 400 and the flexible substrate 120 is confirmed, and the inspection unit determines that each of the first contact pins 402 is in contact with a corresponding one of the third contact pads 125; that is, the inspection contact block 400 is successfully in contact with the flexible substrate 120. Specifically, each of the first contact pins 402 comes into contact with a corresponding one of the third contact pads 125.

Next, for example, the inspection unit either inputs a signal to the electronic module 110 through each of the first contact pins 402, or measures a potential of each of the third contact pads, to inspect the electronic apparatus 100. Hence, the inspection unit determines whether the electronic apparatus 100 is defective or non-defective.

Furthermore, after the above inspection, for example, the through hole 133 formed in the insulating film 132 is preferably blocked with an insulation member made of such an insulation material as an insulation label. Moreover, the through hole 134, the through hole 135, the through hole 136, and the through hole 137 may be blocked with the above insulation member. Such a feature prevents, for example, a short-circuit of the electronic apparatus 100, and shows that the electronic apparatus 100 has already been inspected.

Note that, on the flexible substrate 120, the areas of the third contact pads 125 can be made wider. In accordance with the areas of the third contact pads 125, the first contact pins 402 can be made thicker. Hence, when the inspection contact block 400 is pressed against the flexible substrate 120, the thick first contact pins 402 are less likely to be broken, making it possible to increase durability of the inspection contact block 400. For example, if the second contact pads 123 are used for an inspection of the electronic apparatus 100, the second contact pads 123 are formed to be densely disposed at the end of the base film 121 because the width of the base film 121 is limited and the wires are designed finer. Hence, the contact pins are formed thinner in accordance with the areas of the second contact pads 123, and thus could be easily broken. Moreover, the neighboring second contact pads 123 are densely spaced, and could short-circuit.

Furthermore, for example, the insulating film 132 can be formed thicker than the first wires, the third contact pads 125, the fourth contact pad 126, the fifth contact pad 127, the sixth contact pad 128, and the seventh contact pad 129. Hence, when, for example, the inspection contact block 400 is misaligned with respect to the flexible substrate 120, the contact pins touch the insulating film 132. Such a feature makes it possible to prevent each of the contact pins from making contact with, for example, a contact pad not corresponding to the contact pin, and to avoid such a risk as a short-circuit.

Moreover, the first contact pins 402, the second contact pin 403, the third contact pin 404, the fourth contact pin 405, and the fifth contact pin 406 of the inspection contact block 400 may expand and compress using, for example, a spring, as what is referred to as a pogo pin does. Here, a range of the expansion and compression is preferably narrower than the thickness of the above insulating film.

The present invention shall not be limited to the above embodiment, and may be replaced with a configuration substantially equal to the configuration of the above embodiment, a configuration that achieves the same advantageous effects as those of the configuration of the above embodiment, or a configuration that can achieve the same object as that of the configuration of the above embodiment.

What is claimed is:

1. An electronic apparatus comprising:
   an electronic module; and
   a flexible substrate electrically connected to the electronic module,
   the flexible substrate including:
   a base film;
   a plurality of first contact pads arranged at one end on the base film in a first direction, and electrically connected to the electronic module;
   a plurality of second contact pads arranged at another end on the base film in the first direction;
   a plurality of first wires arranged on the base film, and each electrically connecting one of the first contact pads and one of the second contact pads together; and
   a plurality of third contact pads arranged on the base film, each of the third contact pads being positioned along the first direction between one of the first contact pads and one of the second contact pads, and being electrically connected to one of the first wires,
   the electronic apparatus further comprising a fourth contact pad and a fifth contact pad arranged on the base film, electrically insulated from the first wires, and electrically connected together, wherein:
   the fourth contact pad and the fifth contact pad are disposed in different positions along the first direction; and
   the fourth contact pad is positioned closer to the one end in the first direction than the third contact pads are, and the fifth contact pad is positioned closer to the other end in the first direction than the third contact pads are,
   the electronic apparatus further comprising a sixth contact pad and a seventh contact pad arranged on the base film, electrically insulated from the first wires, and electrically connected together, wherein:
   the sixth contact pad is positioned closer to the other end in the first direction than the third contact pads are, and the seventh contact pad is positioned closer to the one end in the first direction than the third contact pads are;
   the fourth contact pad and the fifth contact pad are positioned closer to one end in a second direction than the third contact pads are, the second direction being orthogonal to the first direction; and
   the sixth contact pad and the seventh contact pad are positioned closer to another end in the second direction than the third contact pads are.

2. The electronic apparatus according to claim 1, wherein the third contact pads are larger in area than the second contact pads.

3. The electronic apparatus according to claim 1, wherein two of the third contact pads closest to each other are disposed in different positions along the first direction.

4. The electronic apparatus according to claim 1, wherein a distance between two of the third contact pads closest to each other is longer than a distance between two of the second contact pads closest to each other.

5. The electronic apparatus according to claim 1, further comprising
   a conductive material disposed on each of the second contact pads.

6. The electronic apparatus according to claim 1, further comprising:
   an insulating film disposed on the base film to cover the first wires, wherein
   the insulating film includes a through hole that coincides with each of the third contact pads.

7. The electronic apparatus according to claim 6, further comprising
   an insulating member blocking the through hole.

* * * * *